(12) United States Patent
Libera et al.

(10) Patent No.: US 6,350,652 B1
(45) Date of Patent: Feb. 26, 2002

(54) PROCESS FOR MANUFACTURING NONVOLATILE MEMORY CELLS WITH DIMENSIONAL CONTROL OF THE FLOATING GATE REGIONS

(75) Inventors: Giovanna Dalla Libera, Monza; Bruno Vajana, Bergamo; Matteo Patelmo, Trezzo Sull'Adda, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/587,214

(22) Filed: Jun. 1, 2000

Related U.S. Application Data

(63) Continuation-in-part of application No. 09/426,094, filed on Oct. 22, 1999.

(30) Foreign Application Priority Data

Oct. 23, 1998 (EP) .............................. 98830644
Jun. 4, 1999 (EP) .............................. 99830347

(51) Int. Cl.[7] .......................................... H01L 21/336
(52) U.S. Cl. ...................... 438/257; 438/258; 438/264; 438/266
(58) Field of Search ................................ 438/257, 258, 438/264, 266

(56) References Cited

U.S. PATENT DOCUMENTS

| 5,472,887 | A | | 12/1995 | Hutter et al. | ............... 438/231 |
| 5,612,237 | A | * | 3/1997 | Ahn | ............... 257/316 |
| 6,087,211 | A | * | 7/2000 | Kalnitski et al. | ............ 438/264 |
| 6,124,167 | A | * | 9/2000 | Kao et al. | .................... 438/257 |
| 6,159,795 | A | * | 12/2000 | Higashitani et al. | ......... 438/257 |
| 6,172,394 | B1 | * | 1/2001 | Nakagawa | ................... 438/257 |
| 6,211,017 | B1 | * | 4/2001 | Ono | ........................... 438/264 |
| 6,251,728 | B1 | * | 6/2001 | Patelmo et al. | ............. 438/257 |

FOREIGN PATENT DOCUMENTS

| EP | 0 216 053 | 4/1987 |
| EP | 0 811 983 | 12/1997 |
| JP | 09 283643 | 10/1997 |

OTHER PUBLICATIONS

Shiba and Kubota, "Downscaling of Floating–Gate EEPROM Modules for ASIC Applications," *Electronics and Communications in Japan*, Part 2 75(12): 67–76, 1992.

Wolf, Stanley and Richard N. Tauber, *Silicon Processing for the VLSI Era*, vol. 3, Lattice Press, Sunset Beach, California, 1986, pp. 608–611.

* cited by examiner

*Primary Examiner*—Trung Dang
(74) *Attorney, Agent, or Firm*—Lisa K. Jorgenson; E. Russell Tarleton; SEED IP Law Group, PLLC

(57) ABSTRACT

A manufacturing process including: forming a first insulating region on top of an active area; forming a tunnel region at the side of the first insulating region; depositing and defining a semiconductor material layer using a floating gate mask to form a floating gate region. The floating gate mask has an opening with an internal delimiting side extending at a preset distant from a corresponding outer delimiting side of the mask, so that the floating gate region forms inner a hole, and the tunnel region is defined, as regards its length, by the floating gate ask alone. The hole is filled with a dielectric material layer. The surface of the floating gate region is planarized, and an insulating region of dielectric material is made. A control gate region and conductive regions in the active area are then formed.

16 Claims, 14 Drawing Sheets

PROCESS FOR MANUFACTURING NONVOLATILE MEMORY CELLS WITH DIMENSIONAL CONTROL OF THE FLOATING GATE REGIONS

CROSS-REFERENCE TO PRIOR APPLICATION

This application is a continuation-in-part of U.S. patent application Ser. No. 09/426,094, filed Oct. 22, 1999.

TECHNICAL FIELD

The present invention pertains to a process for manufacturing electronic devices comprising nonvolatile memory cells with dimensional control of the floating gate regions.

BACKGROUND OF THE INVENTION

Devices using nonvolatile memories of the EEPROM type, such as smart cards, complex microcontrollers and mass storage devices requiring programmability of the single byte, call for increasingly higher levels of performance and reliability.

In practice, from the technological standpoint, this means that it is necessary to get high levels of performance (i.e., increasingly thinner tunnel oxides, ever more reduced programming voltages, increasingly greater current driving capability of the cells) to coexist with an extremely high reliability: one hundred thousand programming cycles and retention of the stored charge for at least ten years are by now considered the minimum requisites for the acceptance of this type of product on the market.

According to the above, it is necessary to develop new manufacturing processes and new geometries that are able to eliminate some of the critical aspects typical of memories, thus increasing their intrinsic reliability without reducing their performance, both for embedded applications (i.e., wherein the memory cells are associated to special electronic devices) and for stand-alone applications (i.e., wherein the device is merely a nonvolatile memory).

SUMMARY OF THE INVENTION

The embodiments of the present invention provide a manufacturing process that enables the critical aspects of known processes to be reduced.

According to embodiments of the present invention, there are provided a process for manufacturing electronic devices having nonvolatile memory cells and an electronic device comprising nonvolatile memory cells, the process includes defining an active area in a substrate of semiconductor material; forming a first insulating region on top of the active area; depositing a first dielectric material on top of the substrate, the first dielectric material comprising a tunnel area; and forming a floating gate region on top of the first dielectric material layer and on top of the first insulating region, which includes depositing a first semiconductor material layer on top of the dielectric material layer and the first insulating region and selectively removing the first semiconductor material layer using a floating gate mask having an outer delimiting side, an opening with an internal delimiting side facing the outer delimiting side at a preset distance and removing the first semiconductor material layer at the side of the external delimiting side and below the opening to form a hole in the floating gate region and filling the hole with an electrically insulating material; forming a second insulating region surrounding the floating gate region; forming a control gate region on top of the floating gate region; and forming conductive regions in the active area.

BRIEF DESCRIPTION OF THE DRAWINGS

To help in understanding the present invention, a preferred embodiment is now described, purely by way of non-limiting example, with reference to the attached drawings, in which.

DETAILED DESCRIPTION OF THE INVENTION

To aid in understanding of the present invention, a production method subject of U.S. patent application Ser. No. 09/426,094, filed on Oct. 22, 1999, of which this application is a continuation-in-part, is initially described with reference to FIGS. 1 to 25. In detail, this method makes it possible to produce a device comprising LV (low-voltage and high-speed) and HV (high-voltage) NMOS transistors, LV and HV PMOS transistors, and EEPROM memory cells formed by a selection transistor and a memory transistor.

In particular, owing to the duality in forming NMOS and PMOS transistors, the drawings show only the steps for NMOS transistors, and the steps for forming PMOS transistors are described in words alone. The EEPROM memory cells form a memory array, and are produced in a part of the wafer thereafter also designed matrix area 15.

Figure 1:
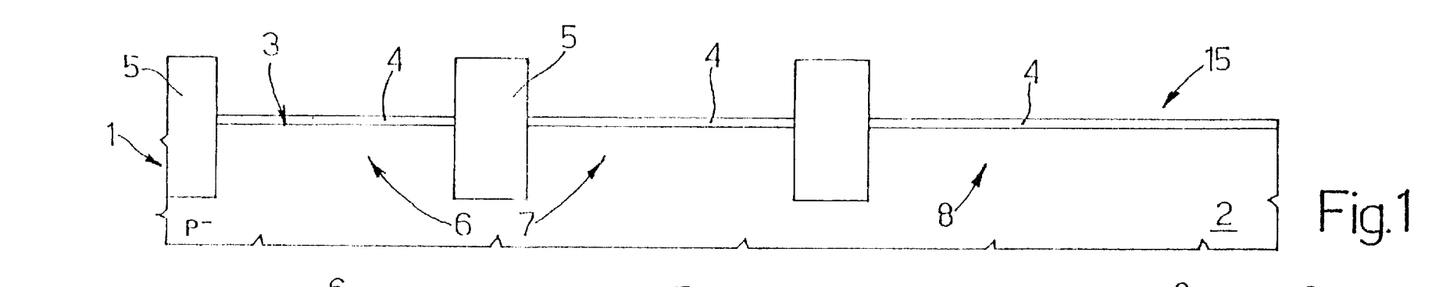
FIG. 1 shows a cross-section of a silicon wafer in a first step of a production method.

In FIG. 1, a wafer 1 formed by a monocrystalline silicon substrate 2, here of P type, has been subjected to the active area definition steps. In detail, with the surface 3 of the substrate 2 covered by an active area mask 4 of non-oxidizable material (typically of a double layer of silicon oxide and silicon nitride, defined using resist), wafer 1 has been subjected to thermal oxidation; consequently, in the parts of the substrate 2 not covered by the active area mask 4, a thick oxide layer (field oxide 5) has been grown, delimiting between each other active areas of the substrate, designed to accommodate various components of the device to be produced. In particular, FIG. 1 shows three active areas, i.e., a LV active area 6, designed to accommodate a LV NMOS transistor, an HV active area 7, designed to accommodate an HV NMOS transistor, and an active matrix area 8, designed to accommodate EEPROM memory cells.

Figures 2, 3:
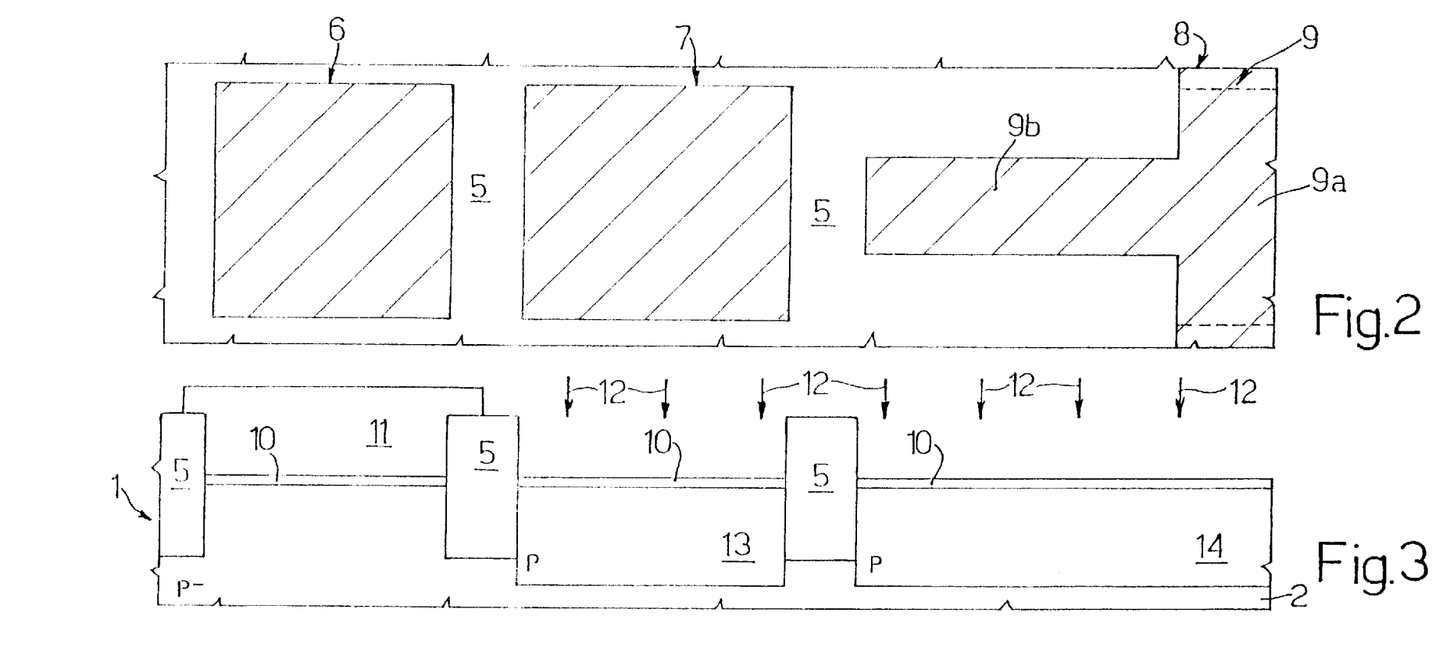
FIG. 2 is a plan view of the wafer of FIG. 1.
FIGS. 3–7 show cross-sections similar to that of FIG. 1, in successive production steps.

In detail, and in a known manner, the active matrix area 8 defines a grid, of which FIG. 2 shows in full only the part relative to one cell, indicated at 9, having substantially the shape of a "T" rotated by 90°, and comprises a leg 9a and a cross-piece 9b. The leg 9a is adjacent to, and electrically connected to, respective legs 9a of other cells arranged above and below the shown cell, of which only parts are visible; in addition, the leg 9a is connected to a leg of an adjacent cell to the right (not shown), which has a symmetrical structure with respect to that shown. The legs 9a are designed to accommodate source regions of the memory transistors; the end of the cross-pieces 9b not connected to the legs 9a is designed to accommodate drain regions of the selection transistors, and the gate regions of the cells must be provided on the cross-pieces 9b. Further active areas are generally provided for forming LV or HV PMOS transistors, not shown in the drawings.

Subsequently, the active area mask 4 is removed, the free surface 3 of the substrate is oxidated to form a sacrificial oxide layer 10, and doping ions of N type are implanted through a mask, for forming N-HV regions (not shown) for the HV PMOS transistors; using an HV P-well resist mask 11, covering the entire surface of wafer 1, except active HV area 7 and matrix area 8, doping ions of P type are implanted, as shown schematically in FIG. 3 by arrows 12. In the substrate 2, P-HV regions 13 of P type for high-voltage transistors, and a P-matrix region 14, also of P type, for the cells are then formed, as shown in FIG. 3. The P-HV regions 13 and P-matrix regions 14 reproduce exactly the shape of the active HV area 7 and matrix area 8, and thus, for each cell, legs 14a (corresponding to legs 9a of active cell areas 9, see FIG. 8), and cross-pieces 14b (FIG. 8, corresponding to cross-pieces 9b) are defined.

Figure 4:
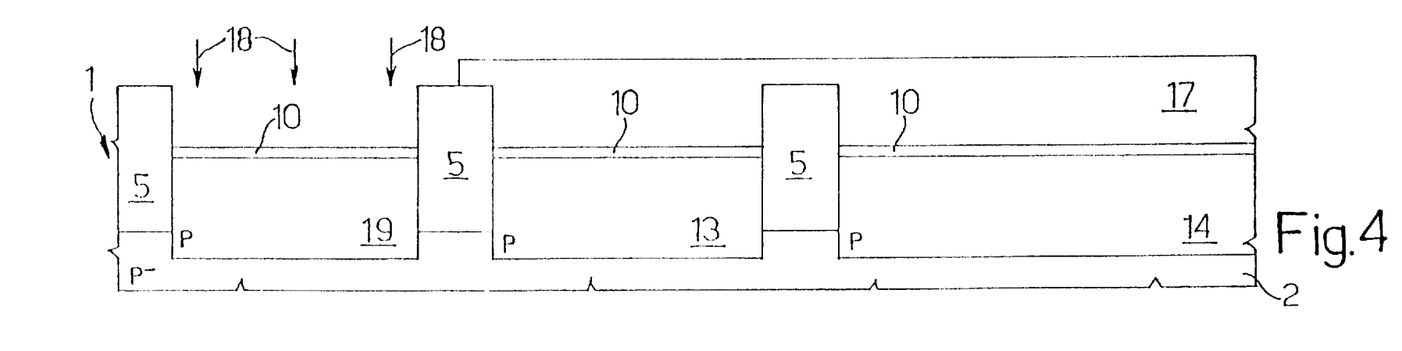

After removing the HV P-well mask 11, doping ions of N type are implanted through a mask for forming N-LV regions (not shown) for the LV PMOS transistors; then, using a LV P-well resist mask 17 covering the entire surface of the wafer 1, except active LV areas 6, doping ions of P type are implanted, as shown schematically in FIG. 4, by arrows 18. In the substrate 2, P-LV regions 19 of P type for the LV NMOS transistors are then formed, as shown in FIG. 4. Thereby, the P-HV region 13 and the P-LV regions 19 are separated from one another, and their electrical characteristics can be optimized with respect to the electrical characteristics required.

Figure 5:
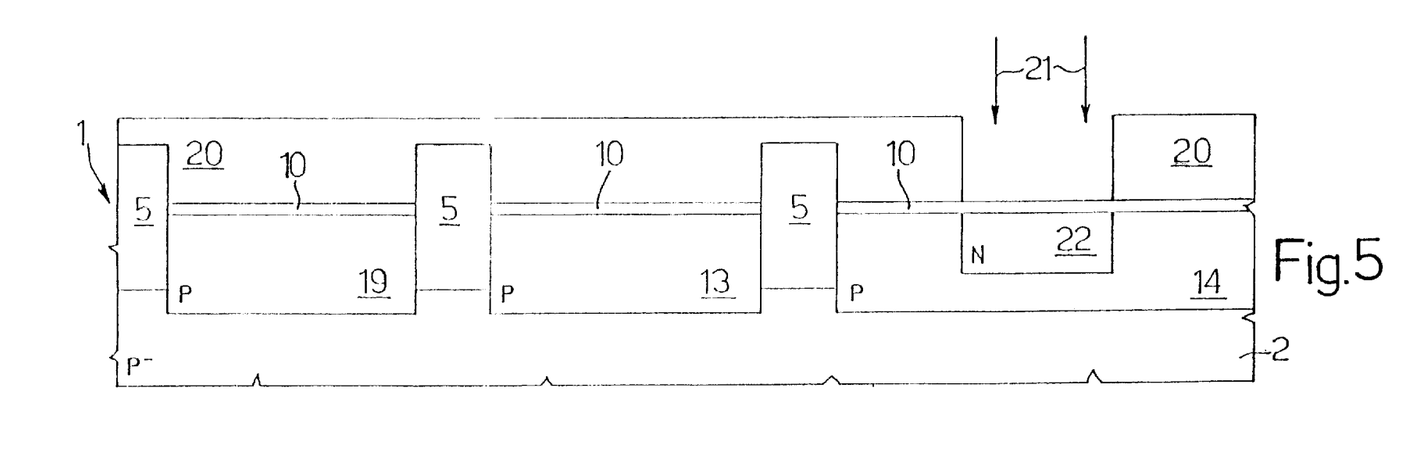
Figure 6:
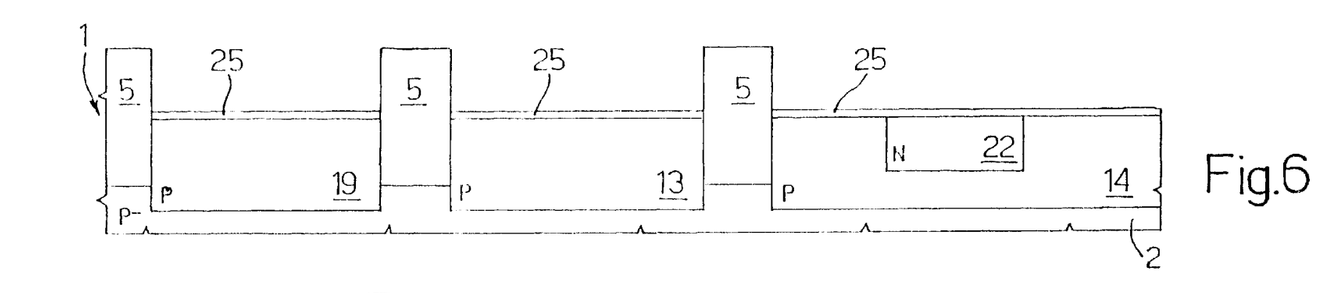

After removing the LV P-well mask 17, a capacitor mask 20 is formed, covering the entire surface of wafer 1, except strips perpendicular to cross-pieces 14b. Doping ions of N type (for example phosphorous) are then implanted, as shown schematically in FIG. 5 by arrows 21. In the cross-pieces 14b, continuity regions 22, of N type, are then formed, as necessary for electrical continuity between each selection transistor and the respective memory transistor of each cell. The structure of FIG. 5 is then obtained.

Figure 7:
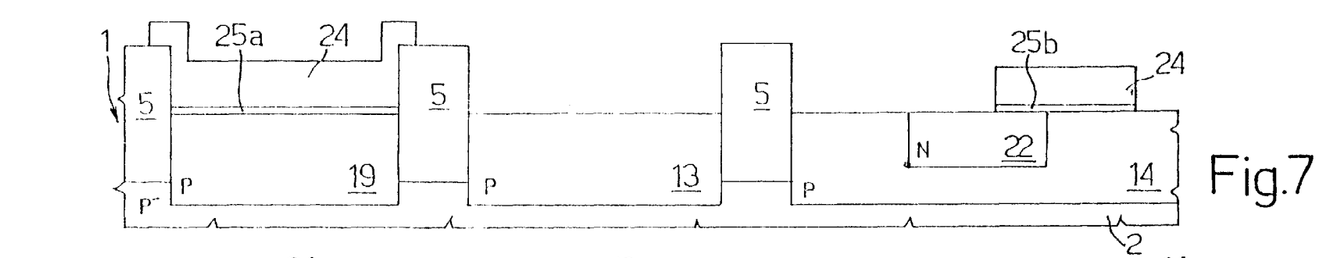
Figure 8:
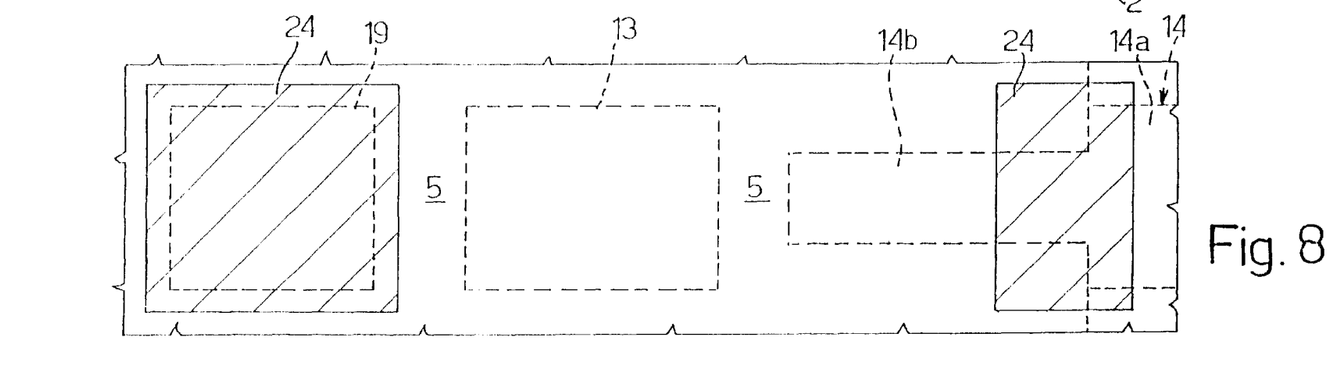
FIG. 8 is a plan view of the wafer of FIG. 7.

After removing the capacitor mask 20, the wafer 1 is subjected to annealing, the sacrificial layer 10 is removed, and matrix oxidation is carried out, forming a matrix oxide layer 25 on the surface of all regions 13, 14, and 19. Then, using a matrix oxide mask 24, shown in cross-section in FIG. 7 and in plan view in FIG. 8, the matrix oxide is removed from everywhere except from beneath the matrix oxide mask 24, forming a region 25b in the P-matrix region 14 that is partially arranged above the continuity region 22, and partially covers the leg 9a, and a masking region 25a on the P-LV region 19 (FIG. 7).

Figure 9:
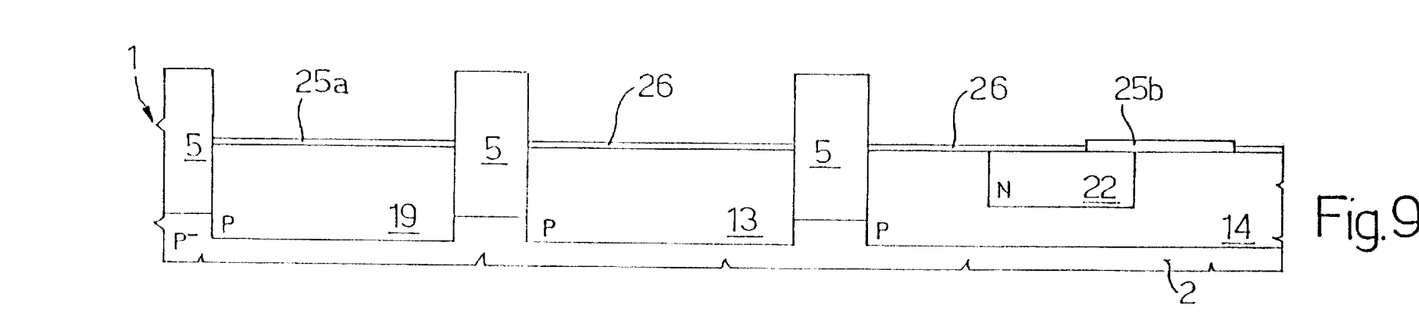
FIGS. 9–11 show cross-sections similar to that of FIG. 7, in successive production steps.

After removing the matrix oxide mask 24, wafer 1 is oxidized again, forming a tunnel oxide layer 26 on the entire surface of the substrate, where the latter is exposed, and increasing the thickness of the oxide that is already present (regions 25a, 25b) in regions 14 and 19. The structure of FIG. 9 is thus obtained.

Figure 10:
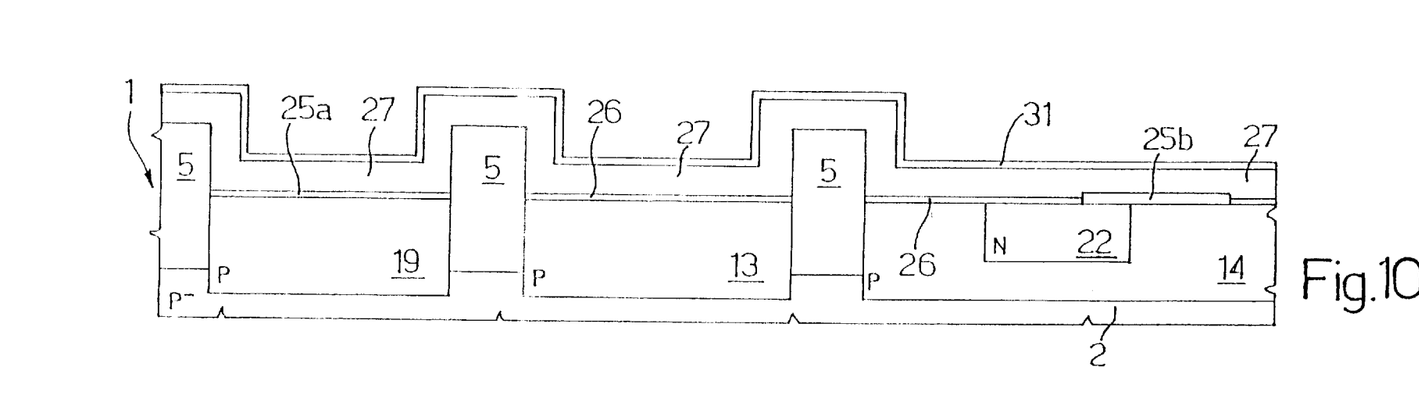

A first polycrystalline silicon layer is then deposited (poly1 layer 27), which is suitably doped; subsequently, an interpoly dielectric layer 31 is formed, for example of a triple layer of ONO (silicon oxide-silicon nitride-silicon oxide), as shown in FIG. 10.

Figure 11:
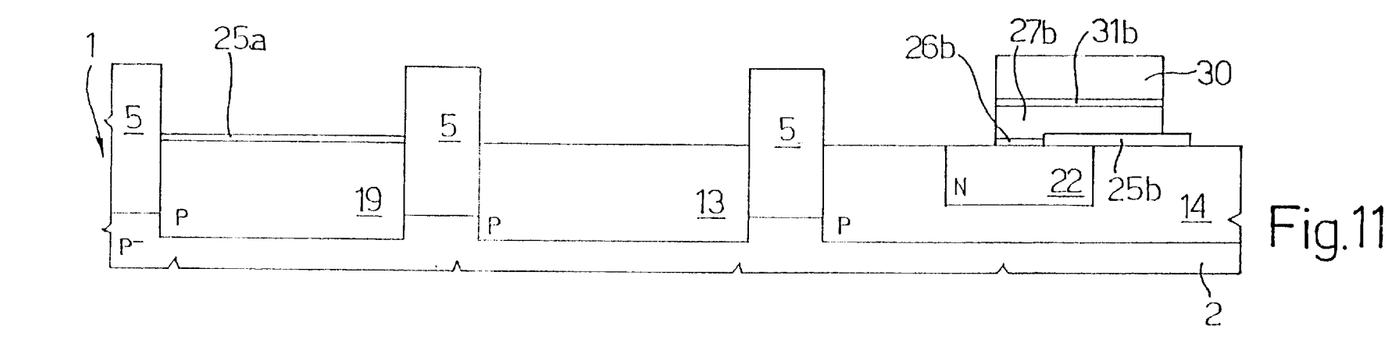
Figure 12:
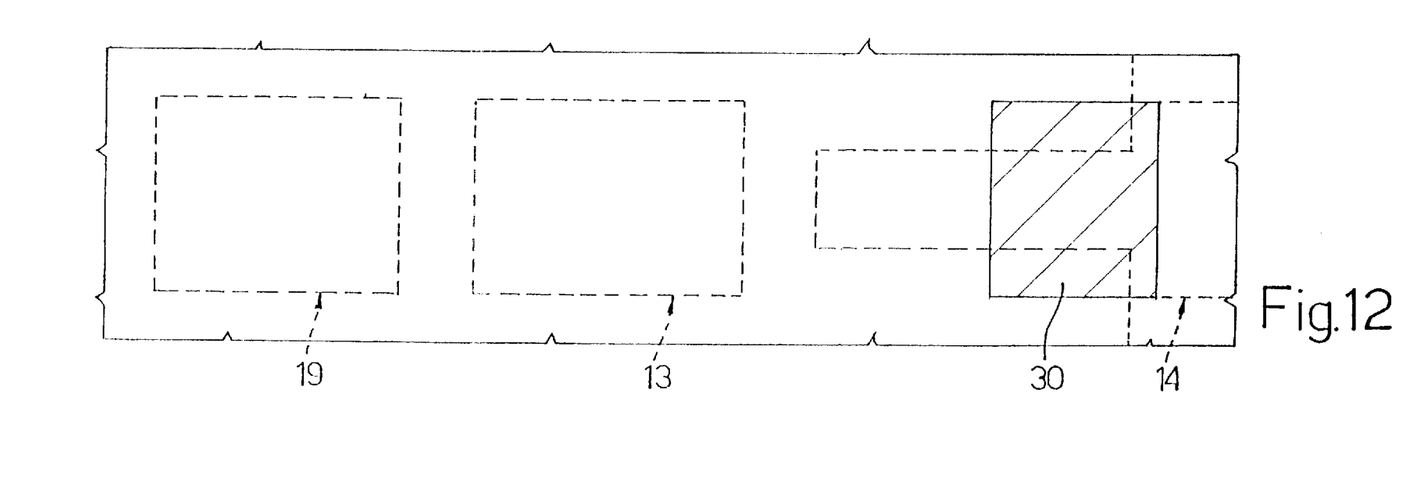
FIG. 12 is a plan view of the wafer of FIG. 11.

A floating gate mask 30 shown in FIG. 11 and 12 is then formed; dielectric layer 31, poly1 layer 27, and tunnel oxide layer 26 are then etched everywhere except where the floating gate regions of the memory transistors are to be formed, indicated at 27b in FIG. 11; consequently, of the tunnel oxide layer 26, only a tunnel region 26b is left, adjacent to an edge of the floating gate region 27b of the memory transistor. In this step, the thickness of the region 25a decreases again on the active area 19.

Figure 13:
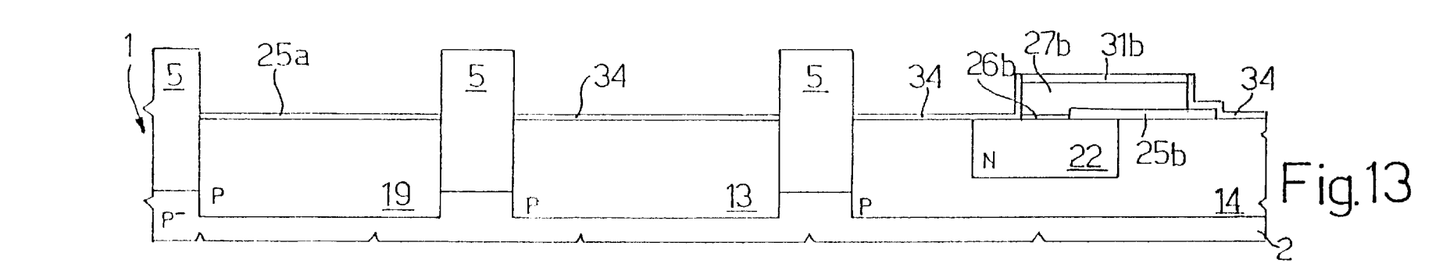
FIGS. 13–17 show cross-sections similar to that of FIG. 11, in successive production steps.
Figure 14:
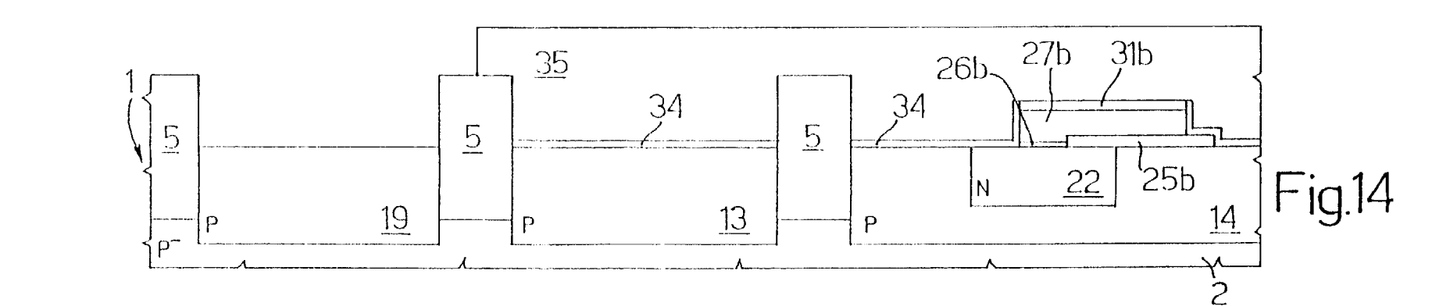

After removing the floating gate mask 30, an HV oxidation step is carried out, forming an HV gate oxide layer 34 on the entire free surface of substrate 2, in particular on P-HV regions 13 and P-matrix regions 14 (FIG. 13). Portions of oxide 34 are also formed laterally to the floating gate region 27b of the memory transistor, as shown in FIG. 13, and the thickness of the region 25a increases again. Subsequently, using an HV oxide resist mask 35, which covers the P-HV region 13 and the matrix area 15, the region 25a is removed from above the P-LV regions 19 (FIG. 14).

Figure 15:
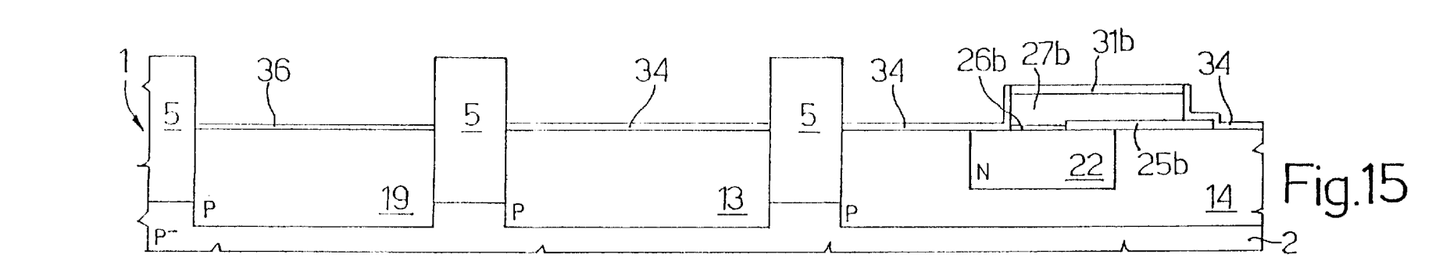

After removing the HV oxide mask 35, a LV oxidation step is carried out, forming a LV gate oxide layer 36 above the P-LV regions 19; in addition, the thickness of the HV gate oxide layer 34 increases above the P-HV region 13 and the P-matrix regions 14, thus providing the structure of FIG. 15.

Figure 16:
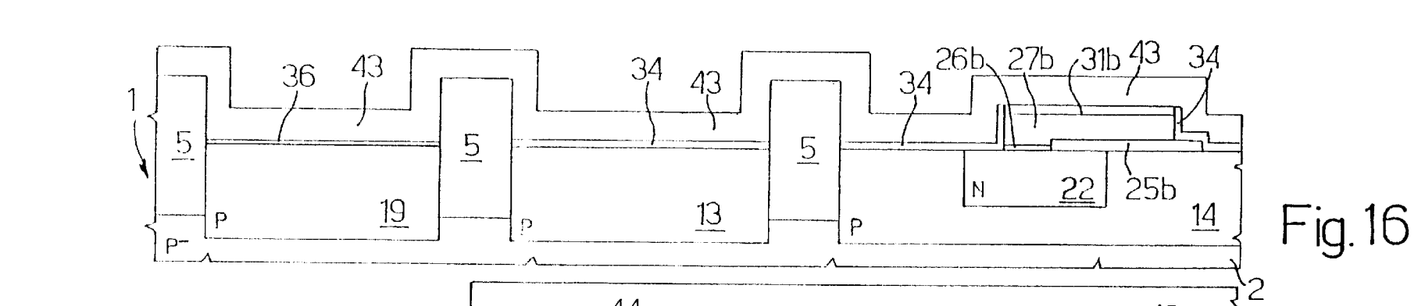
Figure 17:
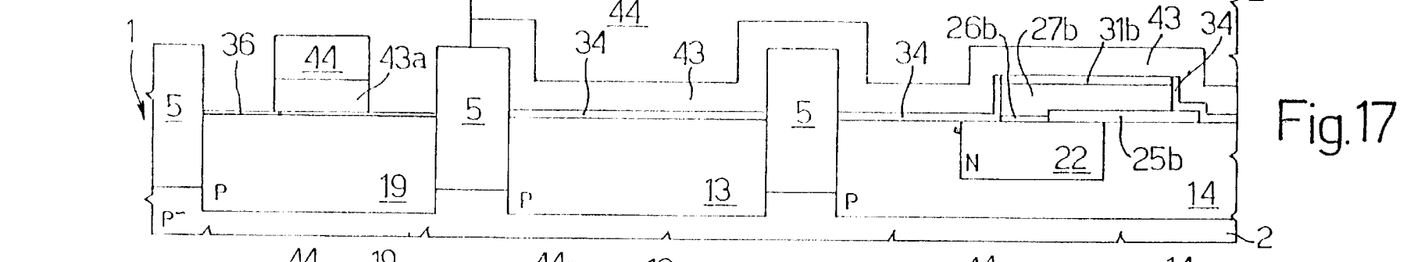
Figure 18:
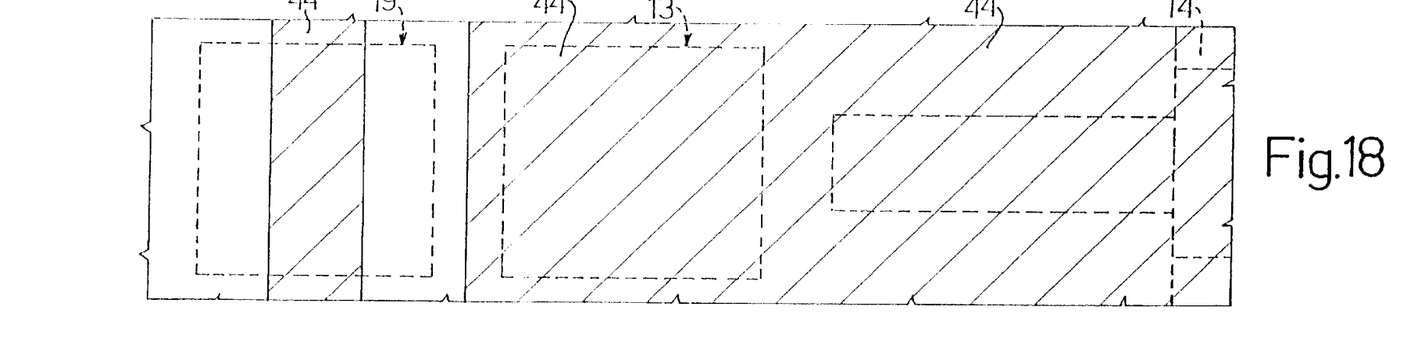
FIG. 18 is a plan view of the wafer of FIG. 17.

Then a second polycrystalline layer (non-doped poly2 layer 43) is deposited, as shown in FIG. 16. A LV gate mask 44 is formed, covering the N-HV regions (not shown), the P-HV regions 13, and the matrix area 15. In addition, the LV gate mask 44 covers the poly2 layer, above the P-LV regions 19, where both the NMOS and PMOS gate regions of the LV transistors must be defined, as shown in FIGS. 17 and 18, and above the N-LV regions (not shown) where the gate regions of the LV PMOS transistors must be defined. The exposed portions of the poly2 layer 43 are removed, thus providing the structure of FIG. 17, wherein the portions of poly2 remaining above P-LV regions 19 form gate regions 43a of the LV NMOS transistors. As can be seen, during the step of defining the gate regions of the LV transistors, the layers above the P-HV regions 13 and P-matrix regions 14 are protected, as are the layers above the N-HV regions (not shown); consequently, the method described provides separate definition of the gate regions of the LV transistors and HV transistors, as well as of the memory cells.

Figure 19:
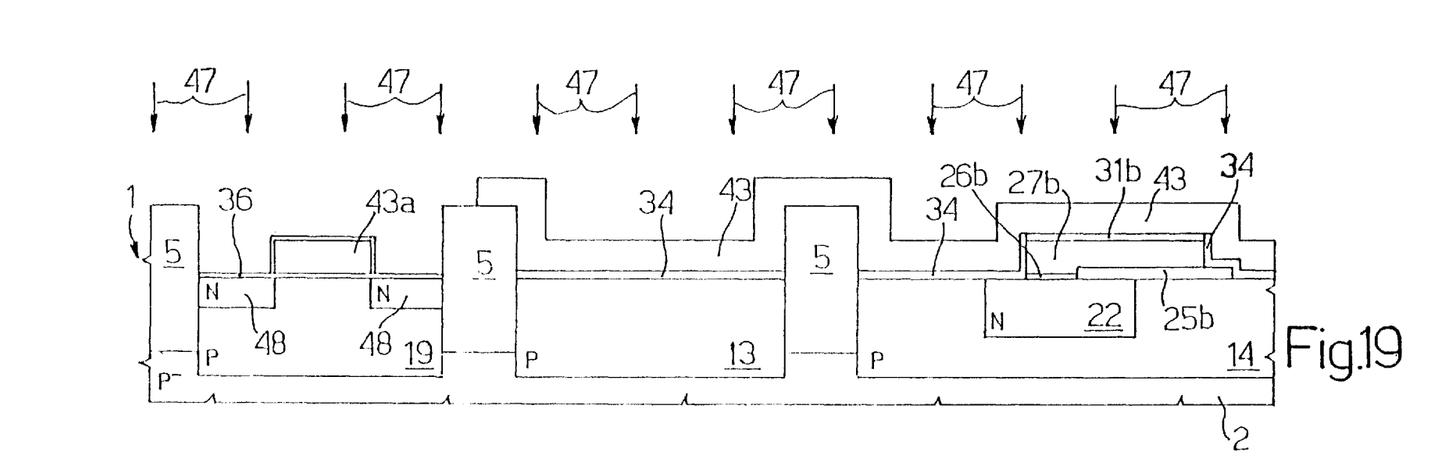
FIGS. 19–21 show cross-sections similar to that of FIG. 17, in successive production steps.

After removing the LV gate mask 44, and re-oxidation, to seal the gate regions 43a of the LV NMOS transistors, using a resist mask not shown, which covers the N-LV and N-HV regions, doping ions of N type are implanted (LDDN implanting), as schematized in FIG. 19 by arrows 47. Laterally on the gate regions 43a (inside the P-LV regions 19), LDD regions 48 of N type are then formed; in addition, the poly2 layer 43 is suitably doped.

Figure 20:
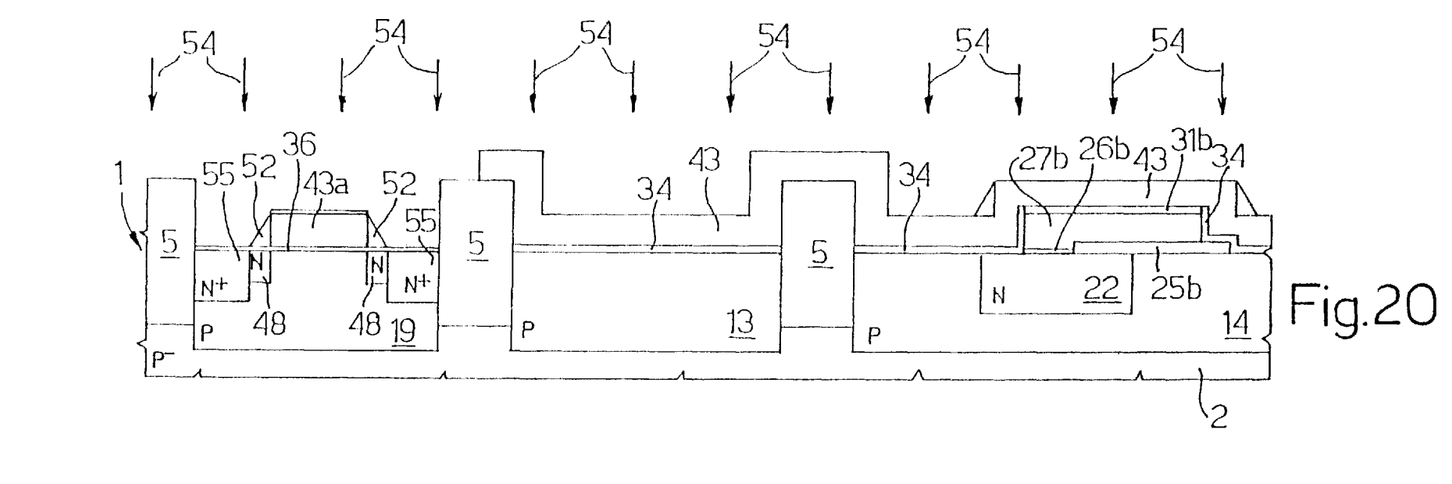

After removing the resist mask, not shown, masked implanting of doping ions of P type is carried out; in particular, during this step, the P-HV 13 regions and P-LV 19 regions, as well as the matrix region 15, are covered, whereas in the N-LV regions, LDD regions of P type (not shown) are formed. On the entire surface of the wafer 1, a dielectric layer (for example TEOS— TetraEthylOrthoSilicate) is then deposited; then, in a known manner, the TEOS layer is subjected to anisotropic etching, therefore it is removed completely from the horizontal portions, and remains laterally to the gate regions 43a, where it forms spacers 52, and partially on the floating gate regions 27b, on the matrix area 15 (FIG. 20). On the other hand, spacers are not formed above the field oxide regions 5, owing to the bird's beak shape of the latter (in a known manner, not shown for simplicity); furthermore, spacers are not formed above the P-HV regions 13 and the respective N-HV regions, since the gate regions of the HV transistors are not yet defined.

Subsequently, using a resist mask not shown, which covers the N-LV and N-HV regions, doping ions of N type are implanted, as schematized in FIG. 20 by arrows 54. LV-NMOS source and drain regions 55 of N+ type are then formed in the P-LV regions 19, in a self-aligned manner with the spacers 52. The LV-NMOS source and drain regions 55 are more highly doped than the LDD regions 48. In addition, the poly2 layer 43 and the gate regions 43a are doped N type, whereas the areas where HV and LV PMOS transistors are to be produced are covered. The structure of FIG. 20 is thus obtained.

After removing the resist mask (not shown), a similar step of masked implanting doping ions of P type is carried out, for forming respective source and drain regions in the N-LV regions (in a not shown manner), and for doping P type the poly2 layer 43, above the N-LV and N-HV regions. In this step, the P-LV regions 19, P-HV regions 13, and P-matrix region 14, are completely covered.

Figure 21:
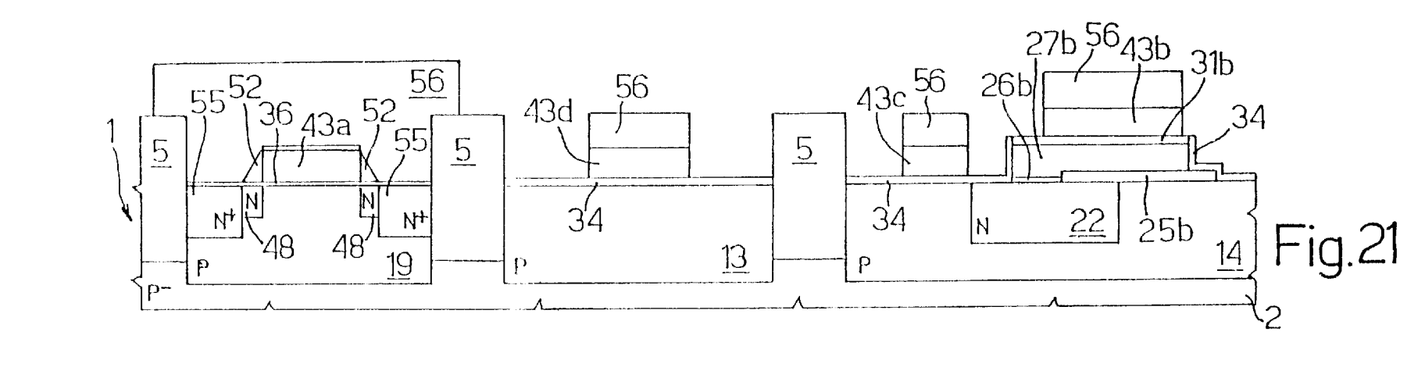
Figure 22:
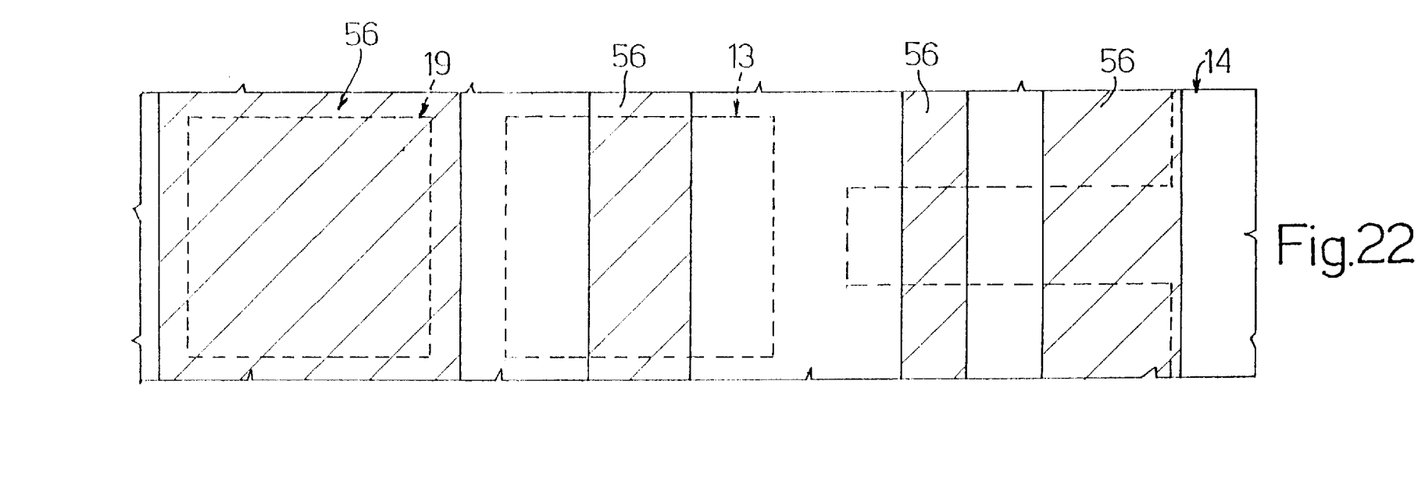
FIG. 22 is a plan view of the wafer of FIG. 21.

Subsequently, an HV gate mask 56 is formed, which covers the surface of the wafer 1, with the exception of the active areas where the gate regions of the high-voltage transistors are to be formed (P-HV regions 13, in the case of HV NMOS), and the portions of the P-matrix region 14 designed to form the gate regions of the selection transistor, and the control gate regions of the memory transistors (in this respect see FIGS. 21 and 22). Then, the portions of poly2 layer 43 not covered by the HV gate mask 56 are etched; the structure of FIG. 21 is thus obtained.

Figure 23:
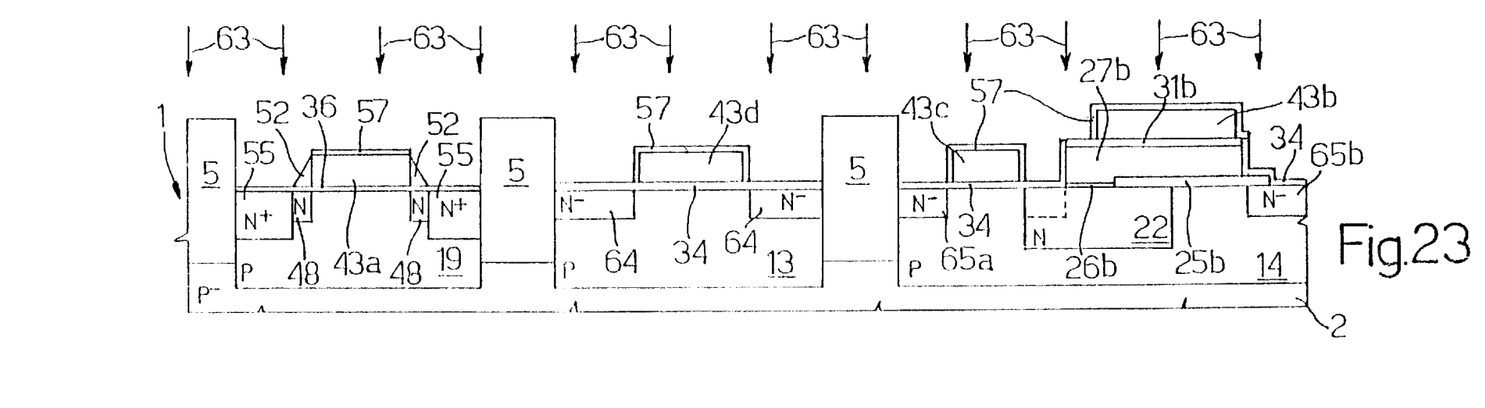
FIGS. 23–25 show cross-sections similar to that of FIG. 21, in successive production steps.

Subsequently, re-oxidation is carried out, forming an oxide layer 57 on the entire free surface of substrate 2, in particular laterally on the floating gate regions 27b and control regions 43b of the memory transistors, and laterally on the gate regions of the selection transistors, as shown in FIG. 23, wherein the gate region of the selection transistor is indicated at 43c, the gate region of the memory transistor is indicated at 43b, and the gate region of the HV NMOS transistor is indicated at 43d.

After removing the HV gate mask 56 and re-oxidation, an NHV mask, not shown, is formed, covering N-LV and N-HV regions (not shown). Using the NHV mask, doping ions of N type are implanted, as shown schematically in FIG. 23 by arrows 63. In P-HV regions 13, at both sides of HV gate regions 43d, HV-NMOS source and drain regions 64 of N type are then formed, less doped than LV-NMOS source and drain regions 55; simultaneously, in the P-matrix region 14, drain regions 65a of selection transistor are formed, on one side, in a self-aligned manner with the gate regions 43c of the selection transistors, and the source regions 65b of the memory transistor are formed on the side not facing the respective selection transistor, in a aligned manner with the gate region 43b of the memory transistors. In addition, the areas arranged between each selection transistor and the respective memory transistor are also implanted; however, this implanting generally takes place inside the continuity regions 22, more doped, and is therefore not shown (for this reason the respective area is represented with broken lines). However, in case of misalignments, this implanting guarantees electrical continuity. The HV-NMOS source and drain regions 64 of the HV selection transistor 65a, and the source regions 65b of the memory transistor (as well as the regions) have a lower doping level than the LV-NMOS source and drain regions 55, and thus have a higher breakdown voltage and higher resistivity.

After removing the NHV mask, the source and drain regions of the HV PMOS transistors (not shown) are similarly implanted using a mask.

Figure 24:
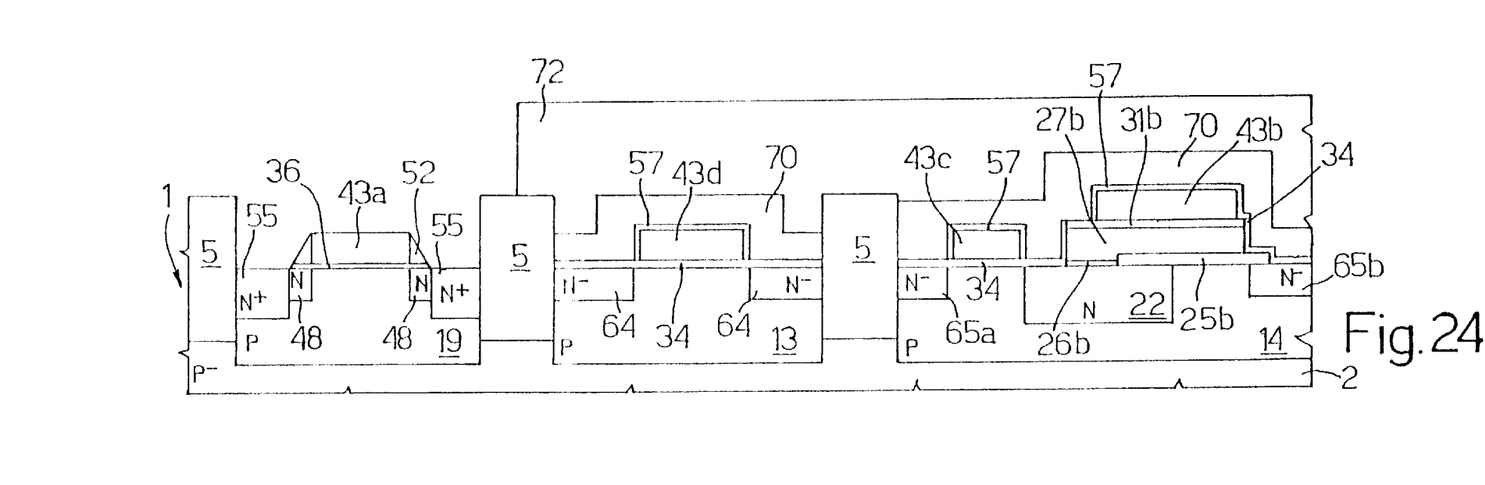

Subsequently a protection dielectric layer 70, for example of TEOS or nitride, is deposited on the entire surface of the wafer 1. A salicide protection mask 72, shown in FIG. 24, is then formed, covering the surface of wafer 1, except the active areas where the low-voltage transistors are formed (P-LV regions 19, for the NMOS). Using the salicide protection mask 72, dielectric layer 70 is removed from above the P-LV regions 19 (FIG. 24). After removing the salicide protection mask 72, if zener diodes, low-doping precision resistors, and/or transistors of N and P type with non-salicided junctions are to be formed, a dielectric layer is deposited and defined using a suitable mask, in a not shown manner. Otherwise, the uncovered poly2 layer are immediately salicided. Saliciding, carried out in a known manner, as previously described, causes titanium silicide regions to form above the source and drain regions of the LV NMOS and PMOS transistors (silicide regions 75a1 above the LV-NMOS source and drain regions 55, and similar regions for the LV PMOS transistors), above the gate regions of the LV NMOS and PMOS transistors (silicide regions 75a2 above the gate regions 43a for the LV NMOS transistors, and similar regions for the LV PMOS transistors), as shown in FIG. 25.

Figure 25:
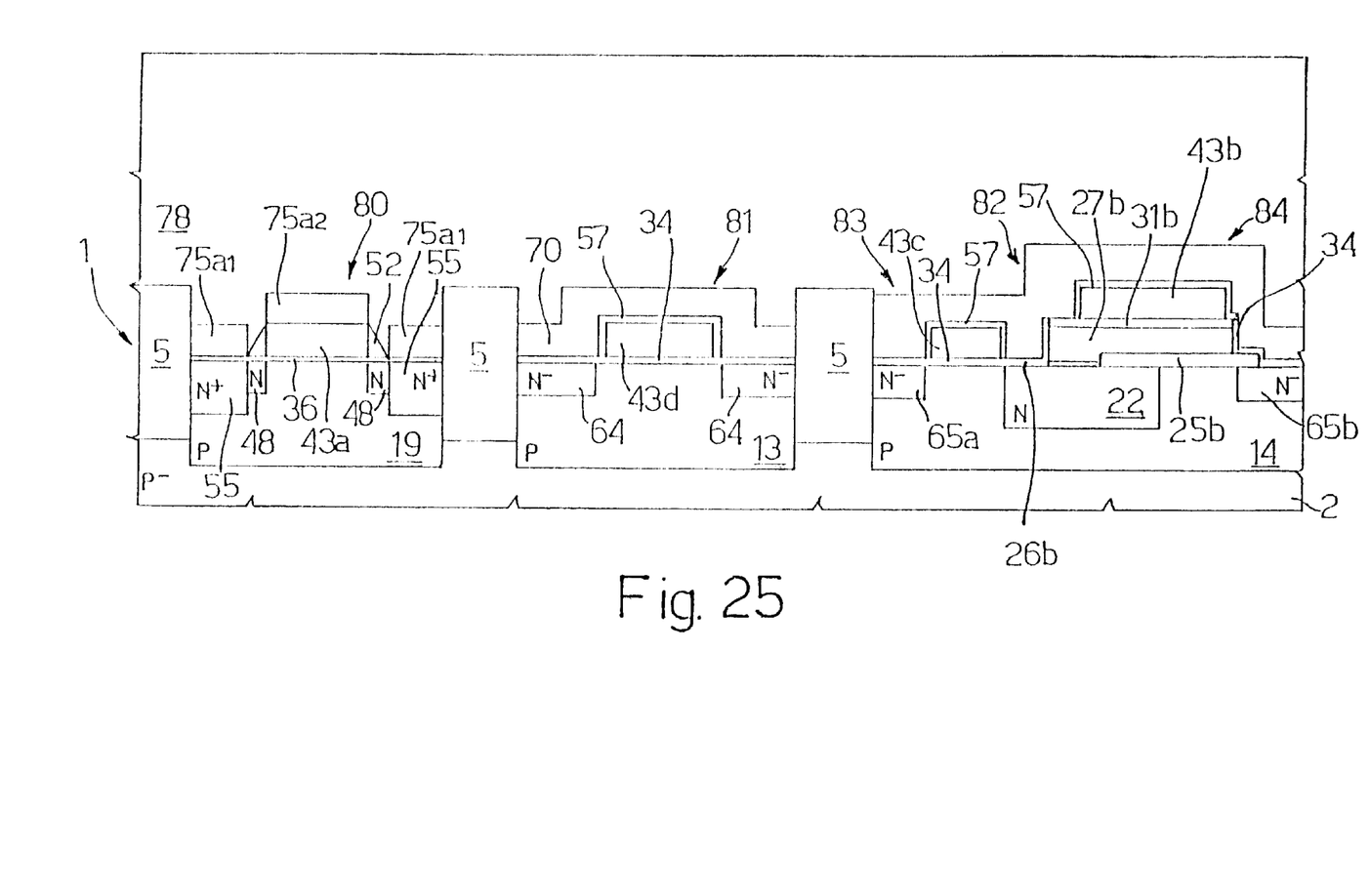

After forming a protection dielectric layer 78, the final structure of FIG. 25 is obtained, showing an LV NMOS transistor 80, an HV NMOS transistor 81, and an EEPROM cell 82, formed by a selection transistor 83 and a memory transistor 84. The final steps follow, including forming contacts and electrical interconnection lines, deposition of a passivation layer, etc.

In the described process, the problem exists that the length of the tunnel area in the horizontal direction of the cross section of FIG. 25, which is equal to the length of the tunnel region 26b, is determined by two different masks, since the left edge of the tunnel region 26b in FIG. 25 is defined by the floating gate mask 30, and the right edge of the tunnel region 26b, delimited by the matrix oxide region 25b, is defined by the matrix oxide mask 24, as is evident from FIG. 11. Consequently, the inevitable misalignments between the two masks 24 and 30 affect the dimensions of the tunnel area in the horizontal direction of FIG. 25. The lack of a precise dimensional control over the tunnel area thus determines a critical situation and a reduction in reliability.

In addition, the above mentioned misaligmnents determine different variations in the dimensions of the adjacent cells. In fact, in a memory array of the described type, adjacent cells (in the horizontal direction of the figures) are arranged alternately in a symmetrical way (in FIG. 2, the adjacent cell to the right of the fully shown cell presents the leg 9a on the left and the cross-piece 9b on the right, whilst the subsequent cell has the same orientation as the shown cell). Consequently, the above misalignment between the two masks towards the left or towards the right causes alternatively an increase of the length of the tunnel region 26b in one half of the cells and a reduction in the remaining half of the cells. It follows that the electrical characteristics of the memory cells are not uniform, but are of two different types, according to whether a particular cell is "even" or "odd", with a consequent reduction in the reliability of the memory array.

To solve the above problem, a new fabrication process is here proposed, and only the steps of the new fabrication different from the previous process are described.

In detail, the present fabrication process comprises the initial steps described with reference to FIGS. 1–9 until depositing the first polycrystalline silicon layer. Subsequently, the interpoly dielectric layer 31 is not formed, as instead it is in the prior process, but a floating gate mask 90 is immediately formed, having a different shape from that used in the prior process, as may be seen in the section of FIG. 26 and in the top view of FIG. 31, in which the floating gate mask 90 is indicated with a two-dash and two-dot line. The floating gate mask 90 has an external perimetral edge 91 of rectangular shape, a side 90a whereof extends perpendicularly to the cross-piece 14b (parallel to the x axis in FIG. 31), in an approximately central position with respect to the cross-piece 14b itself. The floating mask 90 presents an opening 92 delimited by an internal perimetral edge 93. The internal perimetral edge 93 is also rectangular, and its sides are parallel to the sides of the external perimetral edge 91; in particular, a side 90b of the internal perimetral edge 93 facing the side 90a delimits, together with the side 90a itself, a mask portion 94 having a preset width L_(y direction in FIG. 31) corresponding to the desired width for the tunnel area. The position of the floating gate mask 90 and the size of the opening 92 are chosen so that the left hand edge of the matrix oxide region 25b (facing the selection transistor, still to be made) falls within the opening 92 even in the event of misalignments, as will be explained hereinafter. Preferably, the left edge of the matrix oxide region 25b is set roughly in the center of the opening 92; moreover, the latter has, for example, a width of 0.5 μm (for a 0.35 μm process).

Figure 26:
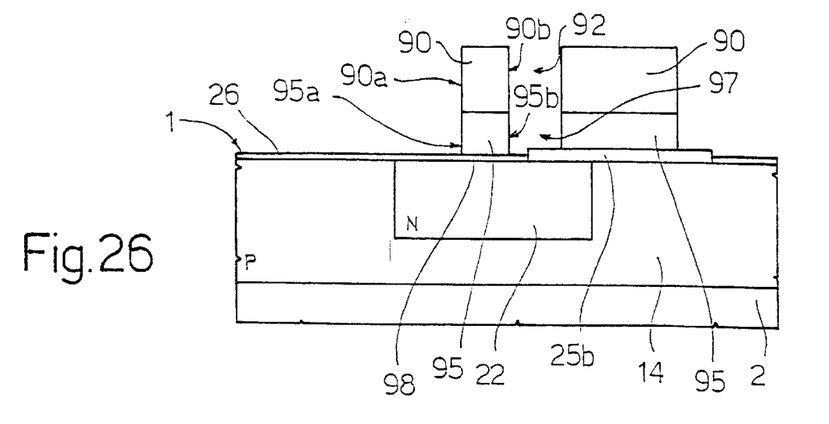
FIG. 26 shows a cross-section through a silicon wafer, in a step of the method according to the invention, for a portion of the wafer housing a memory cell, in enlarged scale.

Subsequently—see FIGS. 26 and 31—the poly1 layer 27 is etched. Because of the floating gate mask 90, here the poly1 layer 27 is removed also internally, under the opening 92. Consequently, at the end of etching, the floating gate region, now indicated by 95, has the same shape as the mask 90, with a hole 97 under the opening 92. In particular, the sides of the floating gate region 95 corresponding to the outer delimiting edge 90a and the inner delimiting edge 90b, indicated by 95a and 95b, respectively, define the length of the tunnel area in the y direction, now determined solely by the dimensions of the floating gate mask 90, and namely by the length L of the mask portion 94.

The size of the tunnel area in the perpendicular direction (x direction in FIG. 31) is instead determined, as in the prior process, by the width of the cross-piece 14b of the P-matrix region 14 (active area of the cell).

Figure 28:
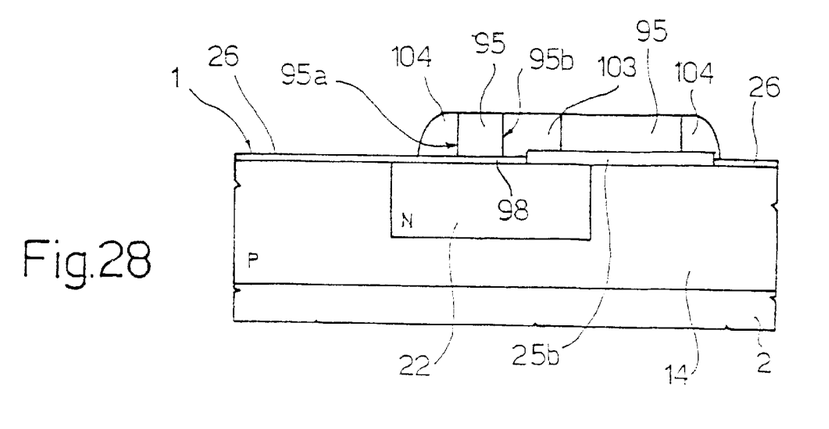

In FIG. 28 and in the subsequent figures, the portion of the tunnel layer 26 delimited by the sides 95a and 95b of the floating gate region 95 and forming the tunnel region is indicated by 98.

Figure 27:
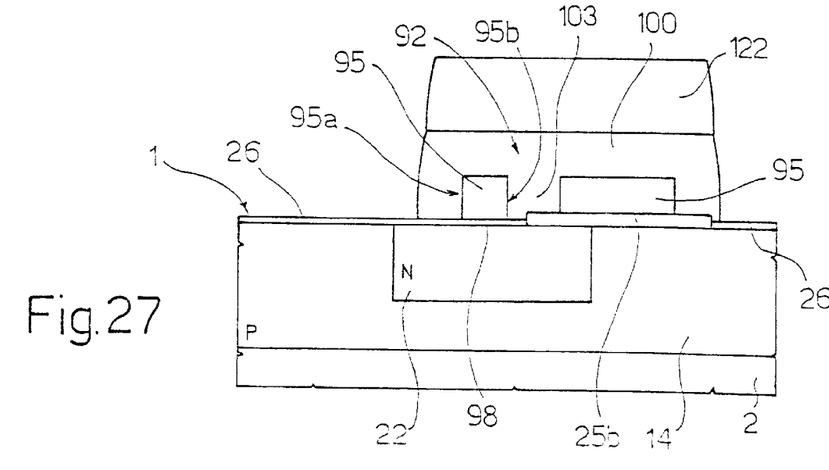
FIGS. 27–30 show cross-sections similar to that of FIG. 26, in successive production steps.

Subsequently, over the entire surface of the wafer 1 a dielectric material layer 100 is deposited, which is, for example TEOS (TetraEthylOrthoSilicate) or silicon oxide deposited at low temperatures. The dielectric material 100 fills the hole 97, where it forms a filling region 103 (FIG. 27). Then, using a dielectric mask 122, indicated in FIG. 31 by a dashed line, the dielectric material layer 100 is removed everywhere, except above, at the sides, and in the hole 97 of the floating gate region 95.

Then, using a chemical mechanical planarization (CMP) technique, the upper surface of the floating gate region 95 is planarized. The dielectric material layer 100 is thus removed from the surface above the floating gate region 95 and remains at the sides of the floating gate region 95 (where it forms side insulation regions 104) and in the hole 97 of the floating gate region 95 (at the filling region 103, as shown in FIG. 28).

Figure 29:
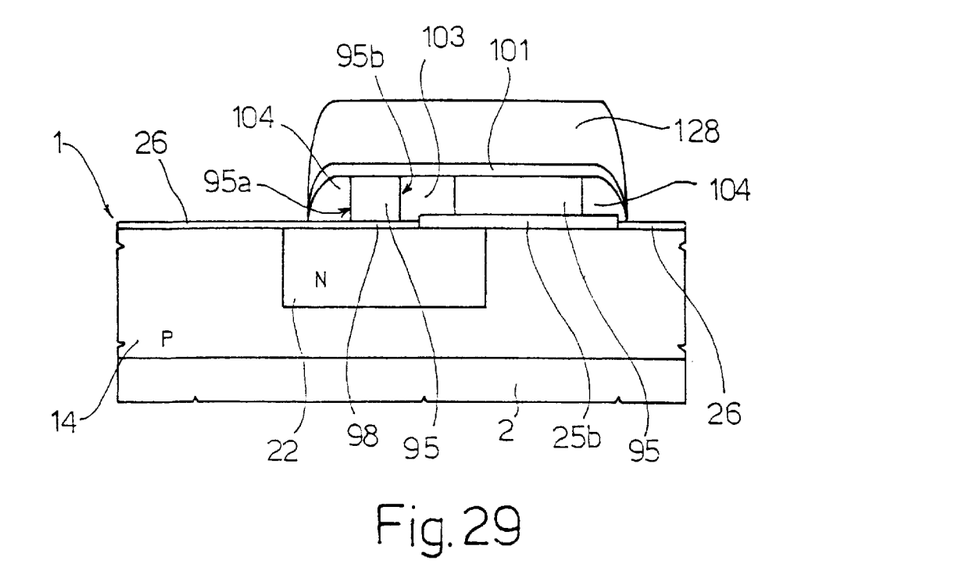

An interpoly dielectric layer 101 is next formed, for example, of a triple ONO layer (silicon oxide-silicon nitride-silicon oxide). Then, using an ONO mask 128, indicated in FIG. 29 and FIG. 31 by a dash-and-dot line and having smaller dimensions than the dielectric mask 122 but larger dimensions than the external dimensions of the floating gate mask 90, the interpoly dielectric layer 101 is removed everywhere, except above the floating gate region 95, so as to seal the floating gate region 95 on the top and on part of the sides of the lateral insulation regions 104.

Next, a high voltage oxide layer 34 is grown (FIG. 30), as was described for the prior process with reference to FIG. 13. The dimensions of the high voltage oxide layer 34, which on the substrate 2 joins the tunnel layer 26 if the latter has not been previously removed, can be calibrated in a known way.

Figure 31:
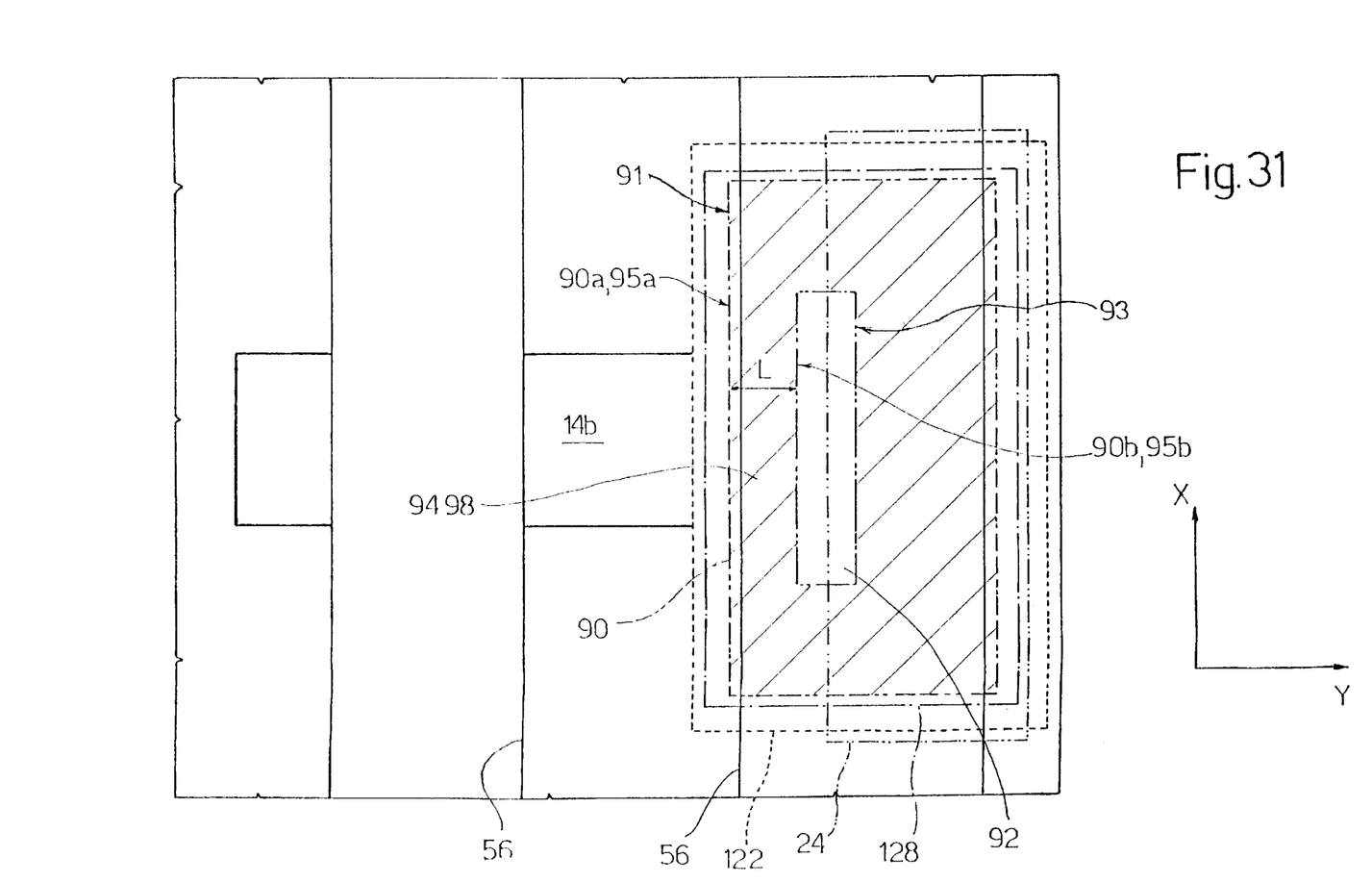
FIG. 31 is a plan view of the wafer portion of FIG. 30, in an enlarged scale, showing part of the masks used in the process according to the invention.

Next, a second polycrystalline silicon layer (poly2 layer 43) is deposited and shaped using a control gate mask, indicated by 56 by analogy with the prior process, and also indicated in FIG. 31 by a thin continuous line.

The previous planarization of the surface of the floating gate region 95 enables deposition of the second polycrystalline silicon layer 43 (which forms the control gate region 43b) on a planar surface, so as to ensure better electrical characteristics.

Figure 30:
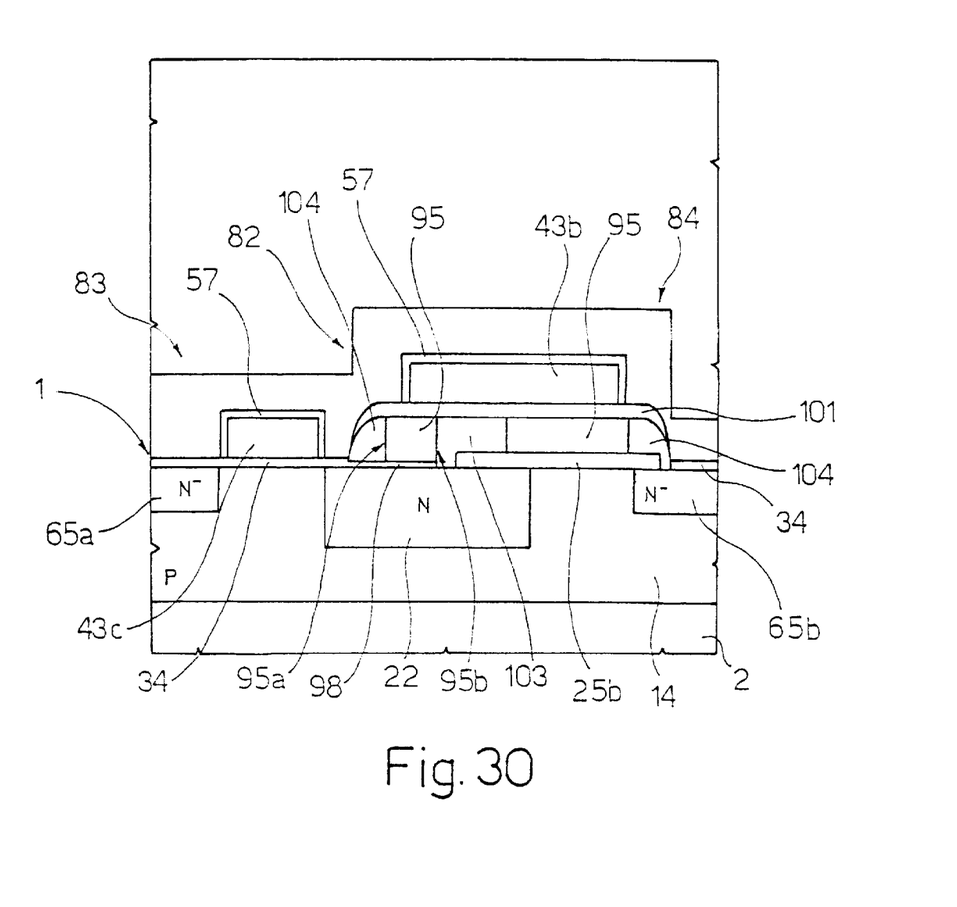

Further steps are then carried out for forming the gate region 43c of the selection transistor 83, the P-channel and N-channel HV and LV transistors, and the conductive regions 48, 55, 64, 65a, and 65b in the active areas. As regards the memory cell 82, the final structure shown in FIG. 30 is then obtained.

The thus described method allows the dimensions of the tunnel area 98 to be controlled with a precision depending only upon the dimensional control of the active area mask 4 and floating gate mask 90, and not upon the misalignments between the masks, which are much harder to control.

In addition, since the dimensions of the tunnel area 98 do not depend upon the misalignments, the variability of the dimensions of "even" cells and "odd" cells discussed above no longer exists, and hence the memory cells 82 present more uniform electrical characteristics.

The filling region 103 of dielectric material moreover ensures complete sealing of the floating gate region 95, so leading to a greater reliability of the cell.

The opening in the floating gate region 95 calls for appropriate re-sizing of the cell. In fact the area of the floating gate region 95 of the sensing transistor 84 is reduced. Consequently, the present memory cell may be advantageously used where the requisites of area occupied are less stringent (for example, but not only, in embedded applications), and wherein it is necessary to have high electrical characteristics and high reliability.

Finally, it is clear that numerous modifications and variations can be made to the method and to the electronic device described and illustrated herein, all of which falling within the scope of the invention, as defined in the attached claims and the equivalents thereof. For example, the tunnel layer 26 may be etched or not when defining the floating gate region 95, and the hole 97, instead of being completely inside the floating gate region 95, may face one side of the latter, perpendicular to the side 95b. In addition, the ONO mask 128, indicated in FIG. 29 and FIG. 31 by a dash-and-dot line, may have bigger dimensions than the dielectric mask 122, and in this case the ONO region 101 covers the sides of the lateral insulation regions 104 completely.

What is claimed is:

1. A process for manufacturing electronic devices having floating gate nonvolatile memory cells, comprising:
    defining an active area in a substrate of semiconductor material;
    forming a first insulating region on top of said active area;
    depositing a first dielectric material layer on top of said substrate; said first dielectric material layer comprising a tunnel area;
    forming a floating gate region on top of said first dielectric material layer and on top of said first insulating region, said forming the floating gate region comprising depositing a first semiconductor material layer on top of said dielectric material layer and of said first insulating region and selectively removing said first semiconductor material layer using a floating gate mask having an outer delimiting side, an opening with an internal delimiting side facing said outer delimiting side at a preset distance, in that said step of selectively removing comprises the step of removing said first semiconductor material layer at the side of said external delimiting side and below said opening, forming a hole in said floating gate region, and filling said hole with an electrically insulating material;
    forming a second insulating region surrounding said floating gate region;
    forming a control gate region on top of said floating gate region; and
    forming conductive regions in said active area.

2. The process of claim 1 wherein filling said hole comprises depositing a second dielectric material layer, said second dielectric material layer comprising a filling region that extends in said hole of said floating gate region.

3. The process of claim 1 wherein said floating gate mask has an external perimetral edge of rectangular shape, in that said opening has an internal perimetral edge of rectangular shape, in that said external delimiting side and said internal delimiting side are parallel to one another, facing one another, and delimit between each other a mask portion defining a length dimension of said tunnel area.

4. The process of claim 1 wherein said opening is arranged astride of or laterally to said first insulating region.

5. The process of claim 2, further comprising, after depositing said second dielectric material layer, planarizing and removing said second dielectric material layer from the upper surface of said floating gate region.

6. The process of claim 5 wherein planarizing and removing is carried out using the CMP technique.

7. The process of claim 5, further comprising, before planarizing and removing, selectively removing said second dielectric material layer on top of said substrate, at a distance from said floating gate region, and forming lateral insulation regions on the sides of said floating gate region.

8. The process of claim 7 wherein said floating gate mask has externally first dimensions, wherein selectively removing said second dielectric material layer is carried out using a second mask having second dimensions larger than said first dimensions, and wherein forming a second insulating region comprises depositing an insulating material layer and selectively removing said insulating material layer using a third mask having third dimensions larger than said first dimensions and smaller than said second dimensions.

9. The process of claim 1 wherein said cell is an EEPROM cell, and further comprising forming a selection transistor laterally to and at a distance from said tunnel region.

10. A manufacturing process, comprising:
    forming a first insulating region on top of an active area in a substrate of semiconductor material;
    forming a tunnel region at the side of the first insulating region;
    depositing a layer of semiconductor material; and
    defining the layer of semiconductor material using a floating gate mask to form a floating gate region, the floating gate mask having an opening with an internal delimiting side extending at a preset distance from a corresponding outer delimiting side of the mask to form a hole in the floating gate region by the floating gate mask.

11. The process of claim 10, wherein the tunnel region is defined with respect to its length by the floating gate mask alone.

12. The method of claim 10, further comprising filling the hole in the floating gate region with dielectric material and forming an insulating region of dielectric material over the floating gate region.

13. The method of claim 12 wherein filling the hole with dielectric material further comprises planarizing the surface of the floating gate region prior to forming the insulating region of dielectric material.

14. The method of claim 13 wherein filling the hole with dielectric material and planarizing the floating gate region includes forming side insulation regions on the sides of the floating gate region.

15. A process for manufacturing nonvolatile memory cells with dimensional control of floating gate regions, the method comprising:
    forming a floating gate mask having an opening over a first polycrystalline silicon layer on a substrate of semiconductor material;
    etching the first polycrystalline silicon layer to form a floating gate region having a hole formed under the opening in the floating gate mask;
    depositing a layer of dielectric material to fill the hole in the floating gate region and to define a tunnel area under the floating gate region;
    depositing a layer of dielectric material to fill the hole in the floating gate region; and
    planarizing the surface above the floating gate region to remove the dielectric material from the surface above the floating gate region and to leave the dielectric material at the sides of the floating gate region and in the hole of the floating gate region.

16. The method of claim 15, further comprising:
    forming an interpoly dielectric layer to seal the floating gate region on the top and at least a portion of the sides thereof;
    growing a high-voltage oxide; and
    depositing and shaping a second polycrystalline silicon layer to form a control gate region.

* * * * *